United States Patent

[11] 3,609,413

[72] Inventors Richard Q. Lane
La Honda;
John S. MacDougall, Los Altos, both of Calif.
[21] Appl. No. 874,533
[22] Filed Nov. 3, 1969
[45] Patented Sept. 28, 1971
[73] Assignee Fairchild Camera and Instrument Corporation
Mt. View, Calif.

[54] CIRCUIT FOR THE PROTECTION OF MONOLITHIC SILICON-CONTROLLED RECTIFIERS FROM FALSE TRIGGERING
7 Claims, 7 Drawing Figs.

[52] U.S. Cl. .......... 307/305, 307/202, 307/252 H, 307/299, 317/235 AB, 317/235 Z
[51] Int. Cl. .......... H02h 7/20
[50] Field of Search .......... 307/305, 299, 202, 252 H; 317/235 (41.1), 235 (40.13), 235 Z, 235 AB

[56] References Cited
UNITED STATES PATENTS

| | | | |
|---|---|---|---|
| 3,210,563 | 10/1965 | New .......... | 307/305 |
| 3,303,360 | 2/1967 | Gentry .......... | 307/305 |

*Primary Examiner*—Donald D. Forrer
*Assistant Examiner*—David M. Carter
*Attorneys*—Roger S. Borovoy and Alan H. Macpherson

ABSTRACT: Power supply voltage transients are prevented from turning on a silicon-controlled rectifier by use of a dual-emitter current switch to short circuit a given PN junction within the silicon-controlled rectifier for the duration of each transient.

INVENTORS
RICHARD Q. LANE
JOHN S. MAC DOUGALL
BY Alan H. MacPherson
ATTORNEY

INVENTORS
RICHARD Q. LANE
JOHN S. MAC DOUGALL

BY Alan H. MacPherson
ATTORNEY

CIRCUIT FOR THE PROTECTION OF MONOLITHIC SILICON-CONTROLLED RECTIFIERS FROM FALSE TRIGGERING

BACKGROUND OF THE INVENTION

1. Field of the Invention

This invention relates to SCR-triggering circuits, and in particular to a circuit for the prevention of triggering of an SCR during the voltage transient following power turn on.

2. Prior Art

Silicon controlled rectifiers, hereafter called SCR's, are well known. An SCR is essentially two transistors, a PNP transistor and an NPN transistor interconnected to form a four-layer PNPN device. In the normally off state, the SCR presents an extremely high impedance to the flow of current. Under these conditions, the SCR is said to be in its "forward blocking" or high-impedance off state. To switch the SCR from its high-impedance state to its low-impedance on state, the common emitter current gains $h_{fe1}$ and $h_{fe2}$ of the individual PNP and NPN transistors making up the SCR must be increased. Because $h_{fe}$ of a transistor is dependent upon the emitter current through the transistor, increasing quite rapidly as emitter current increases, the SCR can be switched from its impedance to its low-impedance state by momentarily increasing the emitter current through one of the two transistors making up the SCR. Several mechanisms exist by which an SCR can be turned on. Most commonly, current carriers are injected into the base region of one of the two transistors making up the SCR by means of voltage applied between the emitter and base of this transistor.

However, because a PN-junction has capacitance, the application of a rapid voltage change across the anode and cathode of the SCR create a charging current which flows through the device from the anode to the cathode. When this charging current exceeds the value necessary to increase the common emitter current gains of the two transistors making up the SCR to a large enough value to turn the SCR on, the SCR turns on independently of the current in the gate electrode. Once turned on, the gate electrode has little effect on the state of the SCR. The SCR remains on until the anode to cathode voltage drops beneath the value necessary to supply the minimum holding current to the SCR. When the anode to cathode current falls beneath this minimum holding current, the SCR switches back to the off state.

One problem with SCR's is that under certain conditions, an SCR turns on in response to the turning on of the power supply of the system. This is undesirable when the SCR is designed to be controlled solely by a gate current and not by the "*dv/dt* effect."

SUMMARY OF THE INVENTION

This invention overcomes the problem of an SCR turning on in response to the turning on of the power supply. The circuit of this invention ensures that an SCR remains in its high-impedance state despite voltage transients on the power supply.

According to this invention, a current switch is provided shunting the base-emitter junction of a selected one of the two transistors comprising an SCR. Responsive to any voltage transients on the power supply circuit, this current switch provides a momentary short circuit to shunt the anode-to-cathode current created in the SCR by the change in power supply voltage.

In one embodiment, this current switch comprises a dual-emitter transistor. The collector of the transistor is connected to the base of one of the two transistors in the SCR, while one of the two dual emitters is connected to the cathode of the SCR. The other of the dual emitters is connected to the anode of the SCR. A voltage transient in the power supply drives a current through the SCR proportional to the rate of change of voltage. Each PN-junction in the SCR has an associated capacitance; in fact, the larger the junction area, the larger the capacitance. Because the voltage across a capacitor is proportional to the integral of the current through the capacitor, the voltage across the capacitor cannot change instantaneously. Accordingly, the instantaneous voltage change on one of the dual emitters is transmitted directly to the base of the dual-emitter transistor. This changes the base voltage of the dual-emitter transistor, so as to turn on this dual-emitter transistor. Current is now conducted through the collector lead and the second emitter of the dual-emitter transistor. The collector current through the dual-emitter transistor however, comprises substantially the collector current of one of the two transistors making up the SCR. Accordingly, the current flowing through the anode-to-cathode circuit of the SCR is shunted through the current switch, thereby preventing the SCR from being turned on. Later, when the SCR is turned on by an increase in its gate current, the dual-emitter current switch remains off, preventing the inadvertent turnoff of the SCR.

When the SCR is on, i.e., in its low-impedance state, voltage transients have no effect on the dual-emitter transistor, the current resulting from these transients being shunted through the low-impedance SCR circuit in parallel with the emitter-to-base capacitance of the dual emitter transistor.

DETAILED DESCRIPTION

Figure 1:
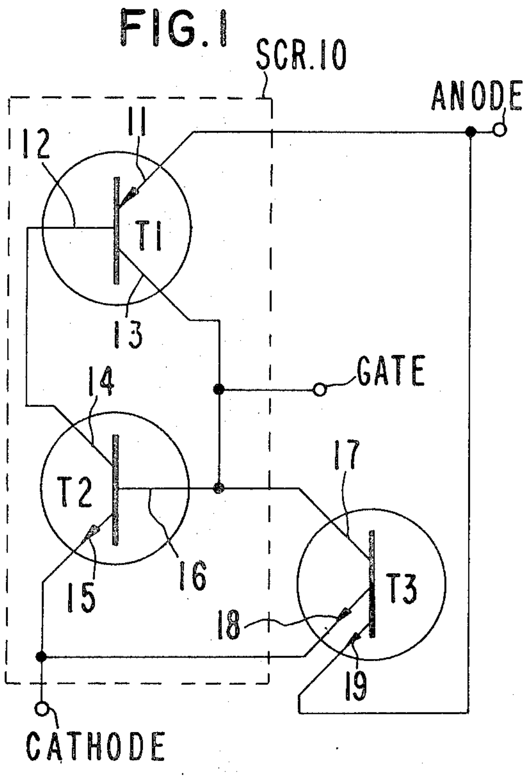
FIGS. 1, 2 and 3 show three embodiments of this invention.

FIG. 1 shows one embodiment of this invention. In FIG. 1, SCR 10 is represented by two cross-coupled transistors, transistors T1 and T2. Transistor T1, with emitter lead 11 comprising the anode of the SCR, contains a base lead 12 connected to the collector 14 of transistor T2, and a collector lead 13 connected to the base lead 16 of transistor T2. Emitter lead 15 of transistor T2 comprises the cathode of the SCR. Typically, the anode and cathode of the SCR are connected to the two terminals of a power supply.

Voltage transients from the power supply, which occur, for example, when the power supply is turned on, rapidly change the voltage across the anode to cathode circuit of SCR 10. These voltage transients may create a large enough current flow through SCR 10 to turn on SCR 10. To avoid this, transistor T3 is provided.

Transistor T3, shown in FIG. 1 as a dual-emitter transistor, has one of its dual emitters, emitter 19, connected to the anode of SCR 10. The other of its dual emitters, emitter 18, is connected to the cathode of the SCR circuit. Collector 17 of transistor T3 is connected to the collector 13 of transistor T1 or equivalently, to the base 16 of transistor T2.

Figure 4:
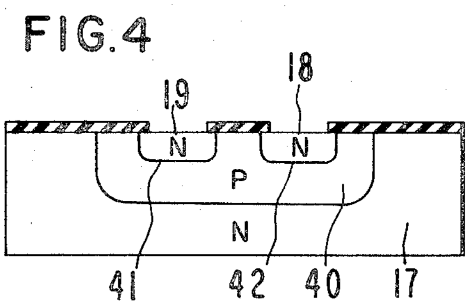
FIG. 4 shows a cross-sectional view of a dual-emitter transistor substrate.

FIG. 4 shows a cross section of dual-emitter transistor T3. P-type base region 40, diffused into N-type collector region 17, in turn has diffused into it two N-type emitter regions, regions 18 and 19.

A voltage surge on the anode of SCR 10 creates a voltage surge on emitter 19 of transistor T3. Because the PN-junction 41 (FIG. 4) associated with emitter region 19 of transistor T3 has a capacitance proportional to the junction area, as well as to the dopant concentrations in those portions of N-type emitter region 19 and P-type base region 40 adjacent to PN-junction 41, the voltage of base region 40 is initially increased in proportion to the voltage surge on the anode of SCR 10. This increase in base voltage turns on transistor T3 which then conducts current through collector 17 and emitter 18. Transistor T3 essentially diverts the collector current on transistor T1 in SCR 10 through transistor T3. This current otherwise would charge the base of transistor T2, thereby turning on the base-emitter junction of transistor T2. Transistor T3 thus prevents the erroneous turning on of SCR 10. The effective capacity of the PN junction between emitter 19 and base 40 of transistor T3, as measured by the collector current of T3, is increased by the current gain of T3 to be greater than that of any PN-junction in SCR 10. Accordingly, transistor T3 remains conducting for the duration of the voltage surge, thus effectively preventing SCR 10 from being turned on.

The only limitation on the operation of transistor T3 shown in FIG. 1 is in the breakdown voltage of the emitter-base junction 41. Typically this voltage can vary from 5–11 volts depending on the process used to produce transistor T3. The processing parameters used to control this breakdown voltage are well known and thus will not be discussed here.

Figure 2:
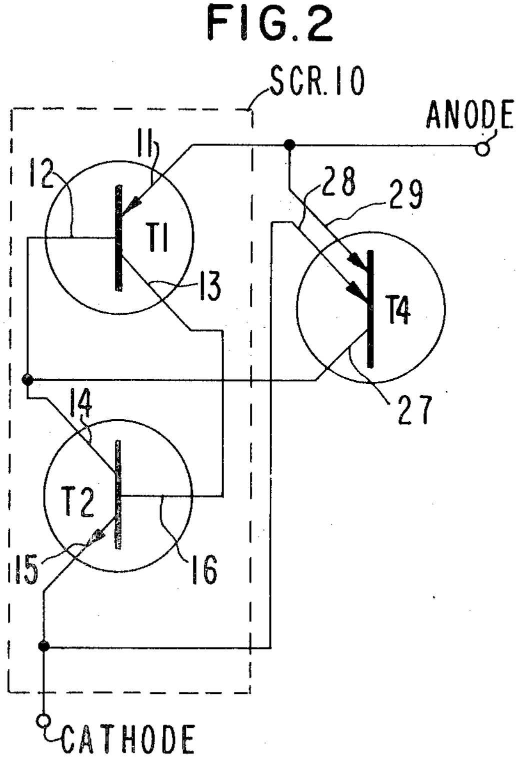

The second embodiment of this invention, shown in FIG. 2, employs a PNP dual-emitter transistor T4 rather than NPN dual-emitter transistor T3 as used in FIG. 1. In FIG. 2, emitter 29 of PNP transistor T4 is connected to the anode of SCR 10, while emitter 28 is connected to its cathode. Collector 27 of transistor T4 is connected to the base 12 of transistor T1 which is also connected to the collector 14 of transistor T2. The circuit of FIG. 2 is just the complement of the circuit of FIG. 1.

Again, a voltage transient is coupled through the capacitance of the PN-junction between emitter 28 and the base of transistor T4 to thereby turn on transistor T4. The current through collector 27 and emitter 29 of transistor T4 then essentially short circuits the emitter-base path of transistor T1.

The embodiment of FIG. 2 is particularly useful in withstanding large voltage surges on SCR 10's anode because the emitter-base junction between emitter 29 and the base of T4 is forward-biased by such surges. The corresponding emitter-base junction in transistor T3 of FIG. 1, on the other hand, is back-biased by such surges.

Figure 3:
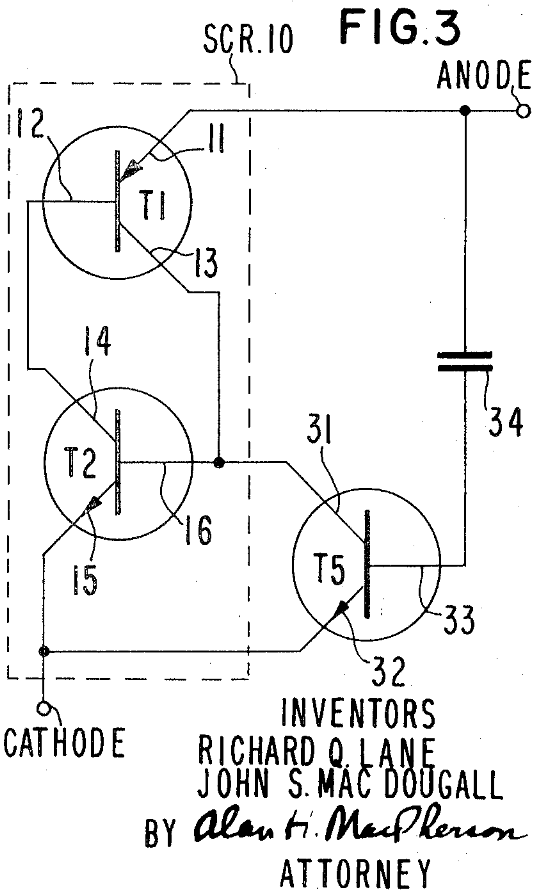

A third embodiment of this invention is shown in FIG. 3. Here, rather than using a dual-emitter transistor T4, a normal NPN transistor T5 is used. Capacitor 34, connected between base 33 of transistor T5 and the anode of SCR 10, transmits any voltage transient on this anode to the base 33 of transistor T5. Such transients turn on transistor T5 which then provides a conductive path via collector lead 31 and emitter lead 32 to short circuit the base-emitter junction of transistor T2 in SCR 10. This prevents SCR 10 from turning on in response to the voltage transient.

Figure 5:
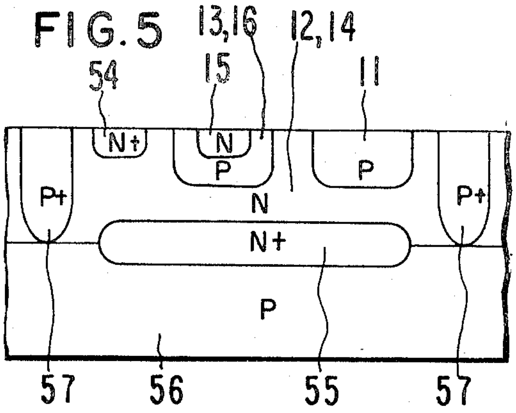
FIG. 5 shows a cross-sectional view of a typical SCR structure.

FIG. 5 shows a cross-sectional view of a typical SCR. For the sake of simplicity in explaining this invention, overlying dielectric and conducting layers have been omitted from FIG. 5. Also, the regions of the structure shown in FIG. 5 which correspond to the emitters, collectors and bases of transistors T1 and T2 making up SCR 10, are identically numbered. P-type substrate 56 has N-type region 12, 14 epitaxially grown on its top surface. Techniques for growth of such an epitaxial region are well known and thus will not be described in detail in this specification. Degenerate buried layer 55, formed at the interface between substrate 56 and epitaxially grown region 12, 14 and doped with an N-type impurity, such as antimony, to a high concentration, reduces the collector resistance of N-type region 12, 14. Contact to N-type region 12, 14 is made by region 54 of degenerate N+ type conductivity.

Diffused in epitaxially grown N-type region 12, 14 are regions 11 and 13, 16 of P-type conductivity. P-type region 13, 16 serves as the collector 13 of transistor T1, shown both in FIG. 1 and FIG. 2. P-type region 11 serves as the emitter 11 of transistor T1. That portion of N-type region 12, 14 between P-regions 11 and 13, 16 is the base 12 of transistor T1. Thus, transistor T1 is essentially a PNP lateral transistor.

Transistor T2 is an NPN transistor. Its collector 14 is formed by N-type region 12, 14, while P-type region 13, 16 serves as the base 16 of this transistor. N-type region 15, diffused within P-region 13, 16, is the emitter 15 of transistor T2.

Diffused P+ type region 57 isolates SCR 10 from adjacent active elements. In an adjacent isolation pocket, transistor T3, a cross section of which is shown in FIG. 4, is typically diffused. Contact between transistor T3 and SCR 10 is made through conductive lead patterns deposited on and adhering to overlying insulation. Such semiconductor integrated circuit techniques are described, for example, in U.S. Pat. No. 2,981,877 issued Apr. 25, 1961 and assigned to the same assignee as this invention.

Figures 6, 7:
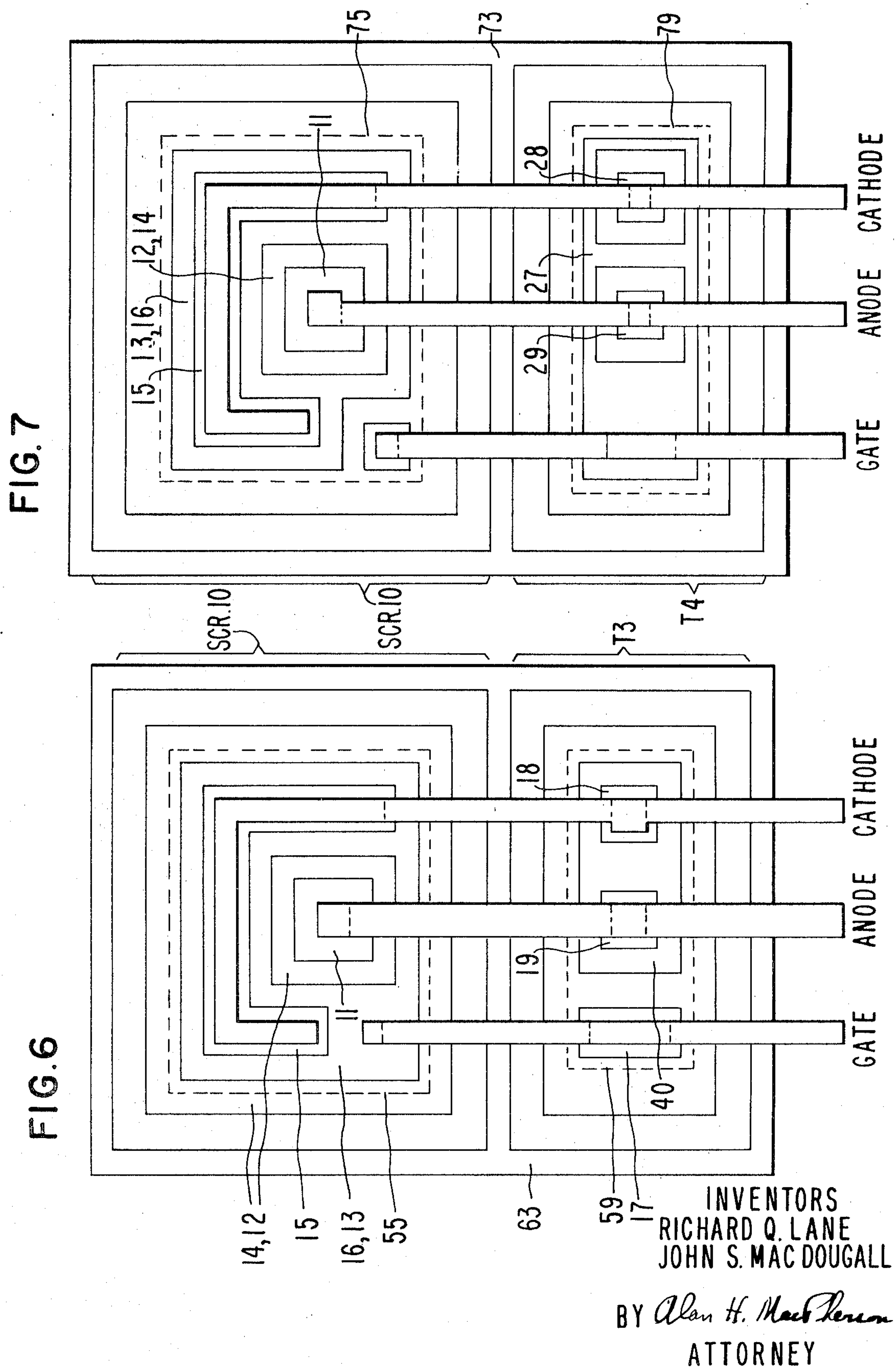
FIGS. 6 and 7 are top views of the circuit of FIGS. 1 and 2, respectively, formed on a semiconductor wafer.

FIG. 6 shows a top view of the circuit of FIG. 1 formed on a semiconductor wafer by standard semiconductor processing techniques. SCR 10 is isolated from T3 by P-type isolation region 63. SCR 10's anode contacts emitter 19 of dual-emitter transistor T3, and emitter 11 of SCR 10's transistor T1. P-type region 11 of transistor T1 is diffused into N-type epitaxially grown base region 12 which also serves as the N-type collector 14 of transistor T2. Also diffused into base region 12 is P-type collector region 13, which also forms base region 16 of NPN transistor T2. N-type emitter 15 of transistor T2 is diffused into P-type region 13, 16. SCR 10's cathode contacts N-type emitter 15 over a substantial portion of the surface in a U-shaped bend, as shown. Buried layer 55, denoted by dashed lines, underlies P-type region 55. It should be mentioned that for illustrative convenience the insulation layer selectively overlying the active semiconductor surface to prevent the anode, cathode and gate conductors from contacting this surface except through contact cuts, has been omitted.

SCR 10's cathode also contacts N-type emitter region 18 of transistor T3. The gate electrode to SCR 10 contacts both the N-type collector region 17 of transistor T3 as well as the P-type base region 16 of transistor T2 and the P-type collector region 13 of transistor T1, as shown. Buried collector layer 59 underlies collector region 17.

FIG. 7 illustrates a similar top view of the circuit of FIG. 2 formed on a semiconductor wafer. Again insulation between the semiconductor top surface and the overlying leads has been omitted for convenience in explaining the underlying structure. SCR 10 is isolated from transistor T4 by P-type isolation diffusion 73.

The structure of FIG. 7 is similar to the structure of FIG. 6. The anode of SCR 10 contacts P-type emitter region 29 of transistor T2 and then extends across isolation diffusion 73 to contact P-type emitter 11 of transistor T1. P-type emitter region 11 is diffused into N-type base region 12, which also serves as the N-type collector region 14 of transistor T2.

The cathode of SCR 10 contacts P-type emitter 28 of dual-emitter transistor T4 and then extends across P-type isolation diffusion 73 to contact N-type emitter region 15 of transistor T2. Emitter region 15 is substantially U-shaped and the cathode contacts this U-shaped region over a substantial portion of its top surface, as shown.

The SCR gate is shown contacting P-type collector region 27 of transistor T4 and then extending across P-type isolation diffusion 73 to contact N-type base 12 of transistor T1 and the N-type collector 14 of transistor T2. A buried layer of degenerate N-type material, typically doped with antimony, is outlined by dashed line 75 beneath the active regions of SCR 10.

Other embodiments of this invention will be obvious in view of this disclosure to those skilled in the semiconductor arts.

What is claimed is:

1. Structure which comprises:

a silicon controlled rectifier containing an anode and a cathode; and switching means connected across at least one PN-junction in said silicon controlled rectifier, said switching means providing a short circuit across said junction in response to a voltage transient on said anode said switching means comprising a dual emitter transistor, the first emitter of which is coupled to said anode, the second emitter of which is coupled to said cathode, and the collector of which is coupled to one side of said PN-junction.

2. Structure as in claim 1 in which said silicon controlled rectifier is formed from two interconnected transistors, one transistor comprising a PNP transistor and the second transistor comprising an NPN transistor, the base of said PNP transistor being connected to the collector of said NPN transistor while the collector of said PNP transistor is connected to the base of said NPN transistor;

the emitter of said PNP transistor comprises the anode of said silicon controlled rectifier, and the emitter of said NPN transistor comprises the cathode of said silicon controlled rectifier.

3. Structure as in claim 2 in which the collector of said dual-emitter transistor is coupled to the base of said NPN transistor.

4. Structure as in claim 3 in which said dual-emitter transistor is an NPN transistor.

5. Structure as in claim 2 in which the collector of said dual-emitter transistor is coupled to the base of said PNP transistor.

6. Structure as in claim 5 in which said dual-emitter transistor is a PNP transistor.

7. Structure which comprises:

a silicon controlled rectifier containing an anode and a cathode; and switching means connected across at least one PN junction in said silicon controlled rectifier, said switching means providing a short circuit across said junction in response to a voltage transient on said anode, said switching means comprising a selected single emitter transistor, the emitter of which is connected to one region of said SCR, the collector of which is connected to another region of said SCR separated from said one region by at PN-junction PN-junction the base of said single emitter transistor being coupled by a capacitor to said anode, thereby to turn on in response to a positive voltage pulse on said anode, and provide a conducting path in shunt with at least one junction of said SCR, thereby to prevent said SCR from turning on in response to said voltage transient.